United States Patent [19]

Biard

[11] Patent Number: 5,572,058
[45] Date of Patent: Nov. 5, 1996

[54] HALL EFFECT DEVICE FORMED IN AN EPITAXIAL LAYER OF SILICON FOR SENSING MAGNETIC FIELDS PARALLEL TO THE EPITAXIAL LAYER

[75] Inventor: James R. Biard, Richardson, Tex.

[73] Assignee: Honeywell Inc., Minneapolis, Minn.

[21] Appl. No.: 503,167

[22] Filed: Jul. 17, 1995

[51] Int. Cl.$^6$ .............................. H01L 29/82; H01L 43/00
[52] U.S. Cl. .................... 257/421; 257/423; 257/426; 257/427; 73/514.08; 73/514.31; 73/DIG. 3; 324/207.2; 324/251; 324/252; 338/32 H
[58] Field of Search .................................. 257/427, 421, 257/423, 426; 73/Dig. 3, 514.31, 514.08; 324/207.2, 252, 251; 338/32 H

[56] References Cited

U.S. PATENT DOCUMENTS

| | | | |
|---|---|---|---|
| 4,829,352 | 5/1989 | Popovic et al. | 257/427 X |
| 4,929,993 | 5/1990 | Popovic | 257/427 X |
| 5,323,050 | 6/1994 | Ristic | 257/427 X |
| 5,530,345 | 6/1996 | Murari et al. | 257/427 X |

OTHER PUBLICATIONS

Popovic, *Hall Effect Devices,* Adam Hilger, Bristol, England, 1991, pp. 1–307.

*Primary Examiner*—William Mintel
*Attorney, Agent, or Firm*—William D. Lanyi

[57] ABSTRACT

A vertical Hall element is formed within the epitaxial layer of a semiconductor and isolated from other components by a P type isolation diffusion. A position defining diffusion is used to accurately locate a plurality of openings within the position defining diffusion where contact diffusions are made. The position defining diffusion is made simultaneously with the base diffusion for transistors within the integrated circuit and the contact diffusions are made simultaneously with the emitter diffusion of transistors within the integrated circuit. Five contact diffusions are provided on the upper surface of the epitaxial layer and generally aligned within the region defined as the Hall element by the isolation diffusions. The center contact is used to provide electrical current flowing through the Hall effect element. Electrical current is split and flows to the two end contact diffusions. The remaining two contact diffusions are used as sensing contacts and are each placed between the center contact and one of the two end contacts. By using the openings within the base diffusion, the contact diffusions can be accurately located and sized in order to improve the efficiency, sensitivity and accuracy of the vertical Hall element.

20 Claims, 8 Drawing Sheets

HALL EFFECT DEVICE FORMED IN AN EPITAXIAL LAYER OF SILICON FOR SENSING MAGNETIC FIELDS PARALLEL TO THE EPITAXIAL LAYER

BACKGROUND OF THE INVENTION

1. Field of the Invention

The present invention is generally related to a Hall effect element and, more particularly, to a vertical Hall effect element for measuring the strength of magnetic fields within an epitaxial layer of a silicon device in which the contact diffusion regions of the Hall effect element are shaped and sized by the configuration and size of openings formed in a position diffusion which is provided specifically for the purpose of defining the position of the contact diffusions of a different conductivity type than the contact diffusions.

2. Description of the Prior Art

The Hall effect has been known for many years. One of the first practical applications of the Hall effect was as a microwave power sensor in the 1950's. With the later development of the semiconductor industry and its increased ability for mass production, it became feasible to use Hall effect components in high volume products. In 1968, Honeywell's MICRO SWITCH division produced a solid state keyboard using the Hall effect. The Hall effect sensing element and its associated electronic circuit are often combined in a single integrated circuit.

In its simplest form, the Hall element is constructed from a thin sheet of conductive material with output connections perpendicular to the direction of electrical current flow. When subjected to a magnetic field, the Hall effect element responds with an output voltage that is proportional to the magnetic field strength. The combination of a Hall effect element in association with its associated signal conditioning and amplifying electronics is sometimes called a Hall effect transducer.

A comprehensive source of information about Hall effect devices is provided in a book by R. S. Popovic which is titled "Hall Effect Devices: Magnetic Sensors and Characterization of Semiconductors" which was published under the Adam Hilger Imprint by IOP Publishing Limited. On page 3 of the Popovic book, a horizontal Hall device is shown in the form of a rectangular plate. Modern Hall element plates are usually manufactured with microscopic dimensions. As an example, the book written by Popovic describes a Hall effect element that has a thickness of approximately 10 micrometers, a length of approximately 200 micrometers and a width of approximately 100 micrometers. When this type of configuration is used for the measurement of a magnetic field which extends perpendicularly through the thickness of the Hall element, it is common to refer to the device as a horizontal Hall element. If, on the other hand, a Hall element is constructed for the purpose of measuring the magnitude of a magnetic field extending in parallel within the plane of a conductor, it is common to refer to the device as a vertical Hall element. The concept of a vertical Hall element is described in the Popovic reference and illustrated in FIG. 5.7 on page 203.

In both horizontal and vertical Hall elements, the output signal from the Hall element is representative of the magnitude of the magnetic field which is perpendicular to the sensing plane of the Hall effect element and perpendicular to the direction of current flow through the Hall element. This principle is well known to those skilled in the art and is true for both horizontal and vertical Hall elements.

When provided in silicon, a horizontal Hall element is typically provided within the epitaxial layer which, in turn, is disposed on a silicon substrate structure. Appropriate current providing contacts and voltage sensing contacts are disposed on the semiconductor and the Hall effect element provides an output signal that is responsive to the magnitude of the magnetic field extending perpendicular to the surface of the epitaxial layer. A vertical Hall effect element manufactured in silicon, on the other hand, is intended to measure the magnitude of a magnetic field extending within the epitaxial layer and parallel to the surface of the epitaxial layer. If the vertical Hall element is considered as being analogous to a horizontal Hall effect element standing on its edge, the height of the Hall effect element is limited to the thickness of the epitaxial layer whereas the thickness of the epitaxial layer merely limits the thickness of the Hall effect plate in a horizontal Hall element. Therefore, the accurate sizing and location of the electrical contacts must be much more precise in vertical Hall elements than in horizontal Hall elements. Since the normal tolerances that are available in typical semiconductor masking operations do not normally provide the necessary accuracy to produce a vertical Hall effect element which has relatively high sensitivity, it would be significantly beneficial if these normal semiconductor masking procedures could be adapted in such a way that the highly accurate positioning and sizing of the contacts for a Hall effect element could be provided.

SUMMARY OF THE INVENTION

The present invention provides a vertical Hall element through the use of the standard masking techniques used to produce transistors within integrated circuits. Since the base, collector and emitter diffusions used to produce transistors in silicon provide a relatively high degree of accuracy in the placement of these elements relative to each other, those same diffusions that are used to produce the base, emitter and collector of a transistor in an integrated circuit can be used advantageously to locate and properly size the contact diffusions used for connecting a Hall effect element to a source of power, two ground connections and two voltage sensing connections. The proper size of the contact diffusions used for the sensing of the Hall output voltage can be accurately determined by controlling the diffusion of a position defining diffusion with a plurality of openings formed therein. By utilizing the same deposition and diffusion steps used to manufacture transistors in an integrated circuit for the same device, the present invention is able to provide accurately placed contact diffusions on the Hall element and thereby improve the operational characteristics of the Hall effect device. In a preferred embodiment of the present invention, an integrated circuit with a vertical Hall element is provided which comprises a substrate that comprises a material of a first conductivity type and an epitaxial layer disposed on the first surface of the substrate. The epitaxial layer comprises a material of a second conductivity type.

A transistor base diffusion is provided within the epitaxial layer and has a depth of a first magnitude. The transistor base diffusion comprises a material of the first conductivity type. A transistor emitter diffusion is disposed within the epitaxial layer and has a depth of a second magnitude. The transistor emitter diffusion comprises a material of the second conductivity type.

A preferred embodiment of the present invention also comprises a means for isolating a Hall effect region of the epitaxial layer. In a particularly preferred embodiment of the present invention, this isolating means comprises an isolation diffusion having a first conductivity type and which surrounds the Hall effect region of the epitaxial layer. The Hall device is further defined by the substrate on the bottom of the Hall effect element and an oxide layer disposed on the top of the Hall effect element and on the upper surface of the epitaxial layer.

In a preferred embodiment of the present invention, a position defining diffusion comprises a material of the first conductivity type which has first, second, third, fourth and fifth openings that are formed therein. The position defining diffusion is diffused within the epitaxial layer simultaneously with the transistor base diffusion that is used during the manufacture of a transistor within the integrated circuit. The first, second, third, fourth and fifth openings of the position defining diffusion are disposed within the Hall effect region defined by the isolating means. In a preferred embodiment of the present invention, first, second, third, fourth and fifth contact diffusions are deposited within the openings and comprise a material of the second conductivity type. The first, second, third, fourth and fifth contact diffusions are diffused into the epitaxial layer simultaneously with the transistor emitter diffusion. The five contact diffusions are disposed within the Hall effect region defined by the isolating means.

In a preferred embodiment of the present invention, a first means is provided for connecting the third contact diffusion to a source of power. A second means is provided for connecting the first and fifth contact diffusions to a point of ground potential. Although the third contact diffusion is described as being connected to a source of power and the first and fifth contact diffusions are described as being connected to a point of ground potential, it should be understood that these connections could be reversed in alternative embodiments of the present invention. In other words, the first and fifth contact diffusions could be connected to a source of power and the third contact diffusion could be connected to a point of ground potential to provide an alternative, but equivalent, arrangement. In effect, the first and fifth contact diffusions are connected to one terminal of a power supply circuit and the third contact diffusion is connected to another terminal of the power supply circuit. A third means is provided for connecting the second and fourth contact diffusions to a means for measuring a voltage differential. In a preferred embodiment of the present invention, the five contact diffusions are aligned on a common axis in sequential order with the third, or central, contact diffusion being connected to a source of electrical power. The first and fifth contact diffusions, located in the linear arrangement of contact diffusions, are connected in electrical communication with a point of ground potential. The second and fourth contact diffusions are connected in electrical communication with a means for measuring a voltage differential. An electrical current is provided at the third contact diffusion and this current flows in opposite directions to the first and fifth contact diffusions. When a magnetic field is imposed in a direction perpendicular to the sensing plane of the Hall effect element and perpendicular to the direction of current flow, the voltage differential between the second and fourth contact diffusions is representative of the strength of the magnetic field.

In a particularly preferred embodiment of the present invention, the first conductivity type material is P type material and the second conductivity type material is N type material. The first, second and third connecting means comprise a metallic layer which can be aluminum. Although not required for the manufacture of the vertical Hall element of the present invention, a buried layer of the second conductivity type can be diffused in to the substrate and into the epitaxial layer and located at the interface between the substrate and the epitaxial layer. In addition, a sinker diffusion of the second conductivity type can be disposed extending through the epitaxial layer and into the substrate. The sinker diffusion and the buried layer can be disposed in electrical contact with each other. It should be understood that the use of a sinker diffusion and a buried layer is advantageous in the manufacture of a transistor within an integrated circuit, but is not necessary in the manufacture of a vertical Hall element made in accordance with the present invention. In one embodiment of the present invention, the transistor base diffusions comprise boron and the transistor emitter diffusions comprise phosphorous. It should be understood that the transistor emitter diffusions could alternatively comprise arsenic.

The lateral dimensions of the first, second, third, fourth and fifth contact diffusions are reduced by the lateral expansion of the position defining diffusion. The position defining diffusion expands during the diffusion process and its edges that surround certain openings within its area advance in such a way so as to reduce the size of those openings. This lateral expansion effect must be taken into account during the determination of the proper size of all five contacts to the Hall effect region. This characteristic is used to particular advantage with regard to the second and fourth openings in order to achieve contacts to the Hall effect region which are smaller in their desired lateral dimension that would normally be possible to achieve using standard semiconductor masking techniques. The structure of the present invention allows a vertical Hall effect element to be produced in silicon by using standard semiconductor mask techniques and procedures rather than requiring the much more accurate positioning that would otherwise be required to locate the contact diffusions for the Hall effect element relative to each other and to provide their relative lateral dimensions. The structure of the present invention and the technique for manufacturing it permit the use of less expensive equipment because of its elimination of the requirement for highly accurate spacing and sizing during the masking operations.

BRIEF DESCRIPTION OF THE DRAWINGS

The present invention will be more fully understood from a reading of the Description of the Preferred Embodiment in conjunction with the drawings, in which.

DESCRIPTION OF THE PREFERRED EMBODIMENT

Figure 1:
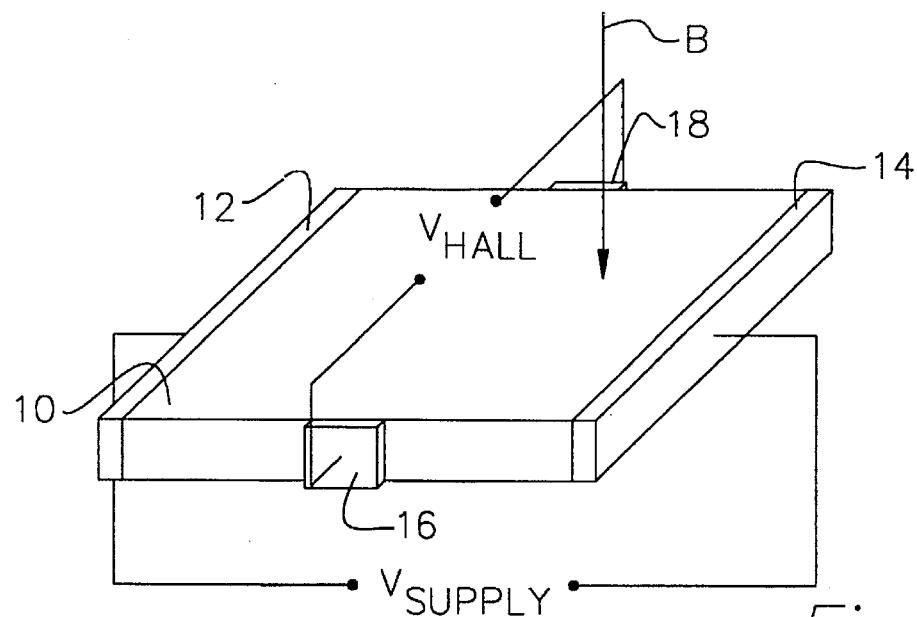
FIG. 1 illustrates a well known configuration for a horizontal Hall element.

Throughout the Description of the Preferred Embodiment, like components and elements will be identified by like reference numerals. FIG. 1 illustrates a horizontal Hall effect element similar to that which is illustrated on page 3 of the Popovic reference described above. FIG. 1 shows a simple plate-like Hall device which comprises a thin plate 10 of conducting material that is provided with four electrical contacts at its periphery. A bias current is supplied through the device via two of these contacts, 12 and 14. A voltage supply is connected to the two current contacts as illustrated. The other two contacts, 16 and 18, are located at two equipotential points on the plate 10. These contacts are used as voltage contacts or sensing contacts. If a perpendicular magnetic field B is applied to the device, a voltage differential appears between the two sensing contacts, 16 and 18, and this voltage signal is referred to as the Hall voltage.

Figure 2:
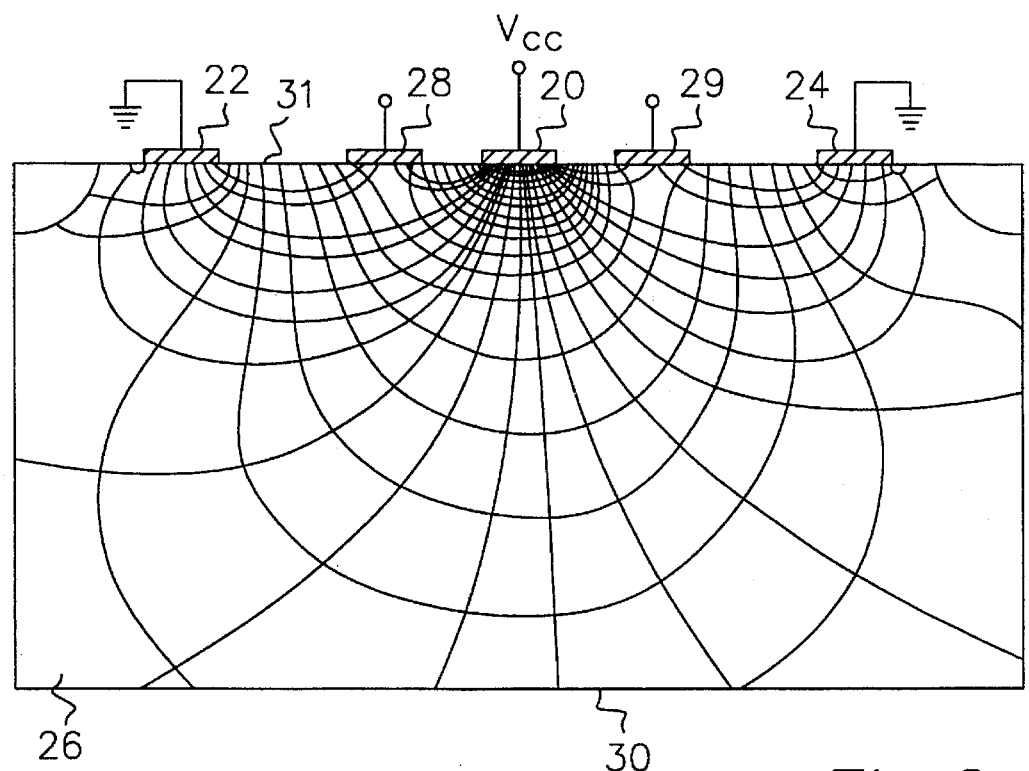
FIG. 2 illustrates the results of numerical modeling of a vertical Hall element.

FIG. 2 is a reproduction of an illustration contained on page 203 of the Popovic reference described above. It is a schematic illustration produced by numerical modeling of a vertical Hall device. The current lines connect the central current contact 20 to the two contacts, 22 and 24, which are connected to ground potential. The equipotential lines are approximately normal to the current lines. The asymmetry of the lines shown in FIG. 2 is due to the Hall effect caused by a magnitude of magnetic field used in the numerical modeling.

With continued reference to FIG. 2, it should be understood that the discussion and illustrations contained on pages 202–204 of the Popovic reference pertain to vertical Hall elements in a CMOS process and, therefore, there is no N type epitaxial layer. These vertical Hall elements are formed in the N type substrate material that is normally used for P well CMOS devices. Therefore, there is a distinct and significant difference between the concepts of the present invention and those that are described and illustrated in the Popovic reference. The vertical Hall element of the present invention is made in a thin N type epitaxial layer on a substrate of the opposite type of conductivity material, whereas the vertical Hall element described in the Popovic reference is made in the N type substrate material. Because of the thickness of the N type CMOS substrate, which is approximately 250 to 300 micrometers, the device described in the Popovic reference does not experience major difficulties relating to the dimensions of the electrical contacts. In comparison, many processes that are used in the manufacture of bipolar transistors must deal with epitaxial layers of N type material that have a thickness of only approximately 10 micrometers. This requires that the contacts be approximately 25 to 30 times smaller in lateral dimension than those discussed in the Popovic reference in order to achieve the same magnetic sensitivity. As is well known to those skilled in the art, Hall effect elements are most commonly made in N type material because the mobility the electrons in N type material is about three times higher than for holes in P type material. In addition, in the vertical Hall element of the present invention, it is desirable to match the characteristics of the horizontal Hall element and this requires that the N type epitaxial layer be used for its manufacture. The conductive material of the Hall effect element shown in FIG. 2, which is identified by reference numeral 26, is the N type substrate of the CMOS process. The two sensing contacts, 28 and 29, are located on the top surface of the substrate, which is identified by reference numeral 31. These two sensing contacts, 28 and 29, are provided so that the voltage potential caused by the magnetic field can be sensed.

Figure 3:
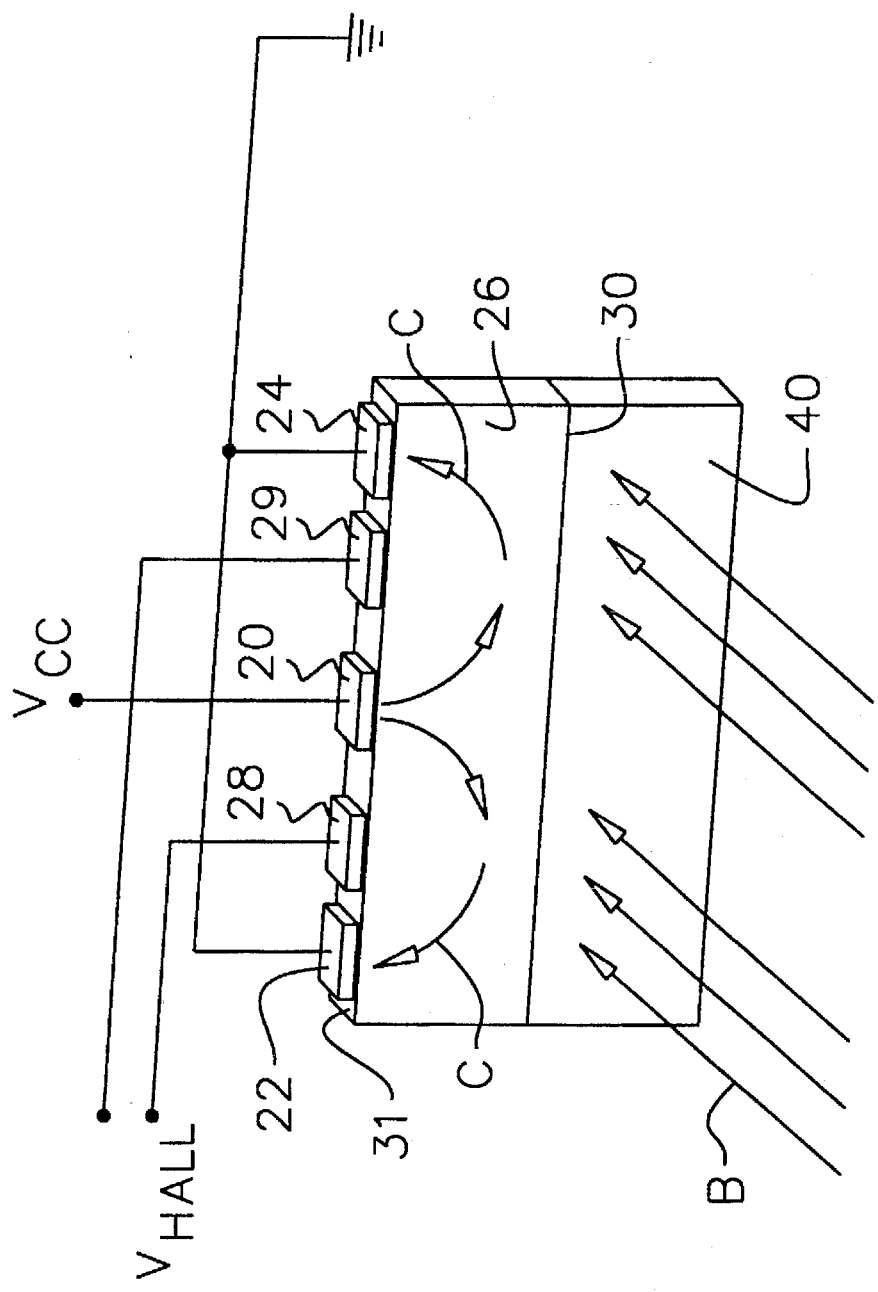
FIG. 3 is a highly schematic representation of a vertical Hall element.

FIG. 3 illustrates a simplified and highly schematic perspective representation of a vertical Hall element. The conductive material 26 is, in effect, a vertical slice of an epitaxial layer disposed on a silicon substrate 40. In other words, the vertical dimension of the vertical Hall element shown in FIG. 3 is generally equivalent to the thickness of an epitaxial layer 26 of a semiconductive device. As a result of the connection of the current contact 20 to a source of power, an electrical current flows in the directions represented by arrows C and is generally split between the current that flows to ground contact 22 and the current that flows to ground contact 24. A magnetic field, which is represented by arrows B in FIG. 3, is imposed in a direction perpendicular to the sensing plane of the vertical Hall element. According to the principles described above, the voltage potentials at sensing contacts 28 and 29 will differ from their magnitudes when no magnetic field is present by generally equal amounts of opposite polarity. As will be described in greater detail below and illustrated in the Figures, surface 30 of the vertical Hall effect element is in contact with a substrate 40 of a semiconductor.

With reference to FIGS. 2 and 3, it should be understood that the Hall element in FIG. 2, which is also discussed in the Popovic reference, is formed in the substrate of a semiconductor device. The Hall effect element shown in FIG. 3, on the other hand, is formed in the epitaxial layer 26 which is disposed on a substrate 40. If carefully manufactured, the device shown in FIG. 2 and described in the Popovic reference will not experience significant problems with regard to the size of the contacts because the substrate material is relatively thick and, as a result, the contacts can be of a relatively large lateral dimension and proper sensitivity could still be achieved. In many bipolar processes, N type substrate material is not used and the only suitable N type layer in which a vertical Hall element can be manufactured is the epitaxial layer which is typically very thin. The thickness of the epitaxial layer is generally between six and ten micrometers. The contacts of the present invention must therefore have a much smaller lateral dimension than those that could otherwise be used in vertical Hall elements made in accordance with the techniques described in the Popovic reference and illustrated in FIG. 2. Both types of Hall elements, whether manufactured according to the principles described in the Popovic reference and shown in FIG. 2 or according to the principles of the present invention, can experience problems related to the offset of the position of the contacts. In order to manufacture the vertical Hall element coincidentally with the manufacture of bipolar transistors, the base diffusion process step must be used to define the contact areas where the later emitter diffusions will contact the epitaxial layer because the contact dimensions for the desired sensitivity are so small. Furthermore, these sequences are necessary to improve the alignment between the contact areas and the isolation diffusion that defines the boundaries of the Hall element region. These relationships will be described in greater detail below. The base diffusions align to the isolation diffusions and the emitter diffusions align to the base diffusions. Each of these individual alignment processes create a position error of up to one micrometer. Therefore, the alignment of the emitter to the isolation can include an alignment error of as much as two micrometers using standard processes.

The same type of deleterious affect can occur as a result of the size of the contact diffusion located under the sensing contact 29. In addition, the size of the current carrying contacts 20, 22 and 24, is also very important. When these contact diffusions increase in size, the Hall voltage tends to increase because the Hall element draws increased current. However, that increase in size also results in a tendency to decrease the Hall voltage due to the disadvantageous shorting effect similar to that found in the sensing contact, 28 and 29. Because of these size related tendencies, the size of all five contacts must be optimized to assure maximum magnetic sensitivity. The optimum size of these contact diffusions is dependent upon the thickness of the Hall element region between surfaces 30 and 31 which defines the height of the Hall element. When the Hall element consists of an epitaxial layer in a typical bipolar integrated circuit manufacturing process, standard manufacturing techniques do not usually provide sufficient accuracy or precision of the photomasks in order to allow optimization of the contact diffusion dimensions.

In order to further describe the size related tendencies discussed immediately above, reference is made to equation 3 that is shown below. The Hall voltage $V_v$ is defined in slightly different terms in equation 3 than in equation 2. In equation 3, the Hall voltage is defined in terms of the applied voltage $V_a$, the Hall mobility $\mu_h$, the component $B_=$ of the magnetic field parallel to the surface 31 and perpendicular to the direction of current flow and several geometric terms. $(T/L)_c$ is the effective thickness to length ratio of the current carrying contacts, 20, 22 and 24. $G_c$ is the geometrical correction factor that is a function of the effective thickness to length ratio of the current carrying contacts, 20, 22 and 24. $G_s$ is the geometrical correction factor that is a function of $(T/L)_s$ which, in turn, is the effective thickness to length ratio of the sense contacts, 28 and 29. Equation 3 illustrates the size related tendencies discussed above. As the effective thickness to length ratio of the current carrying contacts increases, the geometrical correction factor $G_c$ decreases. In the limit for large magnitudes of the effective thickness to length ratio of the current carrying contacts, when the sense contacts are point contacts, the magnitude of $(T/L)_c G_c$ approaches a constant value that is approximately equal to 0.742. This relationship is also discussed on page 168 of the Popovic article in relation to equations 4.23 and 4.24.

Figure 4:
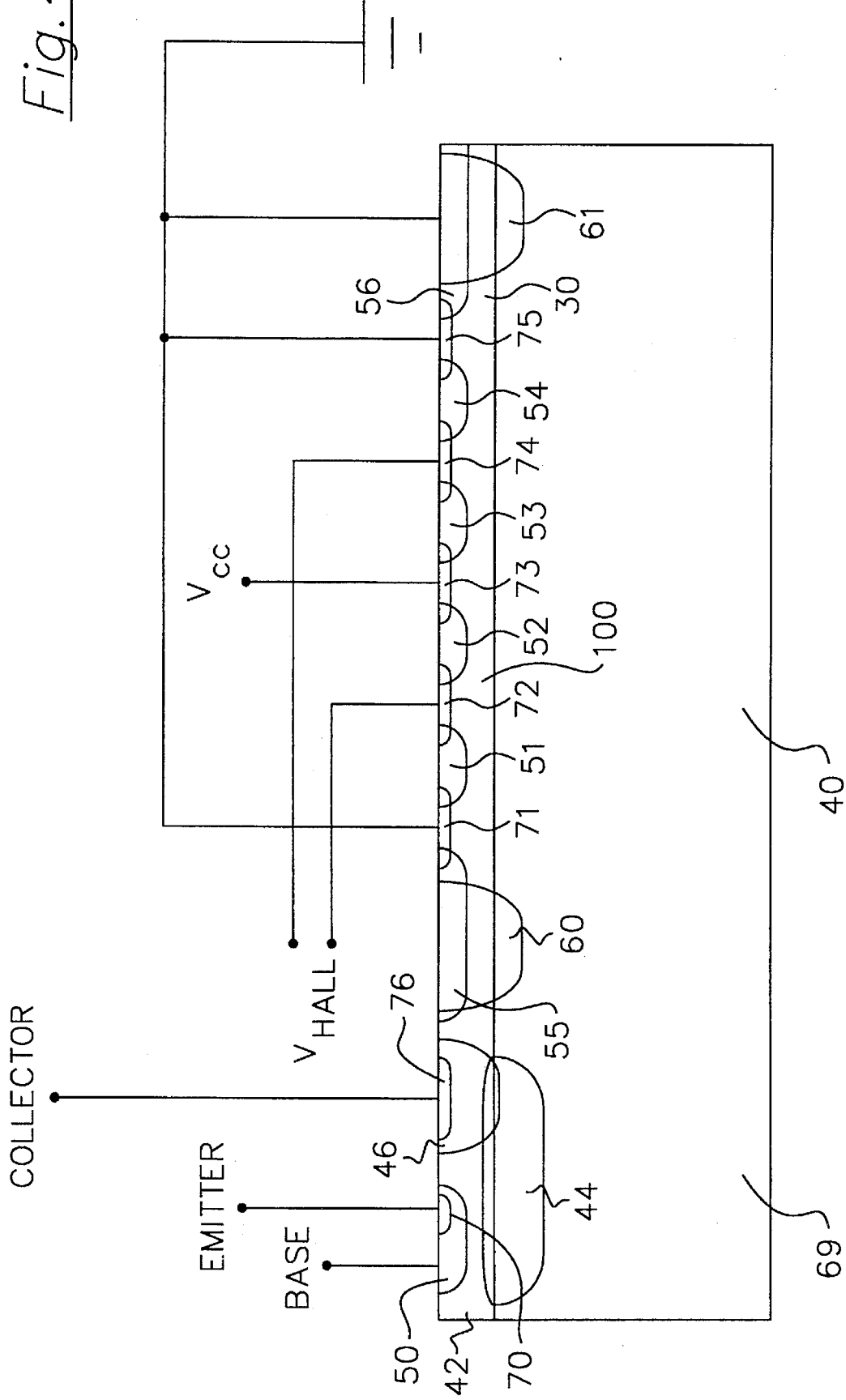
FIG. 4 is a sectional view of a vertical Hall element made in accordance with the present invention.

FIG. 4 illustrates a cross section view of an integrated circuit made in accordance with the principles of the present invention. As will be described below, FIG. 4 shows a transistor located at the left side of the illustration and a vertical Hall element located at its right side. The transistor and the vertical Hall element are illustrated together in FIG. 4 because of the relationship between the sequence of process steps used to manufacture the transistor and the sequential steps used to manufacture the vertical Hall element. An advantage of the present invention is that the vertical Hall element can be manufactured by utilizing some of the same manufacturing process steps used to make the transistor. As a result, accurate positioning and diffusion depths can be advantageously employed to result in accurately sized and located contact diffusions for the Hall element.

In FIG. 4, a substrate 40 is provided and an epitaxial layer 42 is disposed on the upper surface of the substrate. A buried layer 44 is located at the region where the epitaxial layer 42 and the substrate 40 are in contact with each other. For purposes of comparing FIGS. 2 and 3 to FIG. 4, the lower surface of the epitaxial layer 42 is identified by reference numeral 30 in FIG. 4. Throughout the discussion of FIG. 4 and the other Figures which illustrate the diffusions in the semiconductive material, it should be understood that the particular section view illustrates some of the diffusions as individual areas although they are actually part of larger single diffusion. In other words, the base diffusions that are identified by reference numerals 51–56 are all individual portions of a single large base diffusion that has openings formed in it. Furthermore, the isolating diffusions identified by reference numerals 60 and 61 is actually one continuous diffusion. The isolating diffusion laterally surrounds the Hall effect region, but this total size and shape of the isolating diffusion can not be shown in the section views which are necessary to fully describe the configurations of the vertical Hall element made in accordance with the present invention.

A sinker diffusion 46 extends downward from the upper surface of the epitaxial layer 42 to the substrate 40. It is connected to the buried layer 44, which extends laterally at the interface of the substrate 40 and the epitaxial layer 42, as shown. A base diffusion 50 is shown at the left portion of FIG. 4. It provides the base for a transistor of the integrated circuit. At the same time that the base diffusion 50 is deposited, other base diffusions 51–56, are also deposited. The locations of the base diffusions, 50–56, are determined by a single masking step. In addition, the depths of these diffusions are determined simultaneously by the temperature and time of the diffusion process for the base diffusions. As a result, the depths of diffusions 50–56 are all illustrated as being identical to each other in FIG. 4. The diffusions identified by reference numerals 55 and 56 in FIG. 4 serve as capping diffusions that are disposed over isolation diffusions 60 and 61. These isolation diffusions, 60 and 61, are provided as a means for isolating the Hall effect region that is used to provide the vertical Hall effect element. As will be described in greater detail below, the isolating means provided by the isolating diffusion, 60 and 61, defines a central region that is used as the Hall effect element. This region 100 is further confined between the substrate 40 and an oxide layer disposed on the upper surface of the epitaxial layer 42.

The diffusions identified by reference numerals 51–56 in FIG. 4 are all part of a single contiguous diffusion that is deposited and diffused simultaneously with the base diffusion 50. As will be described in greater detail below, the contiguous diffusion is provided with a plurality of openings therein which will be used advantageously to define the location and size of a plurality of contact diffusions.

The emitter diffusion 70 provides the emitter of the transistor shown at the left portion of FIG. 4. Simultaneously with the deposition of the emitter diffusion 70, identical depositions are simultaneously made to form the diffusions identified by reference numerals 71–75 and 76. Diffusions 71–75 are located in the windows, or openings, described above which are contained in the position defining diffusion that comprises the segments identified by reference numerals 51–56. Diffusion 76 is a capping diffusion for the sinker 46 which facilitates contact to the capping layer.

The purpose of the contact diffusions, 71–75, is to provide electrical connection between a metallic layer disposed on the upper surface of the epitaxial layer and the material of the epitaxial layer itself. The locations of the metallic contacts will be described below in conjunction with FIG. 6.

Figure 5:
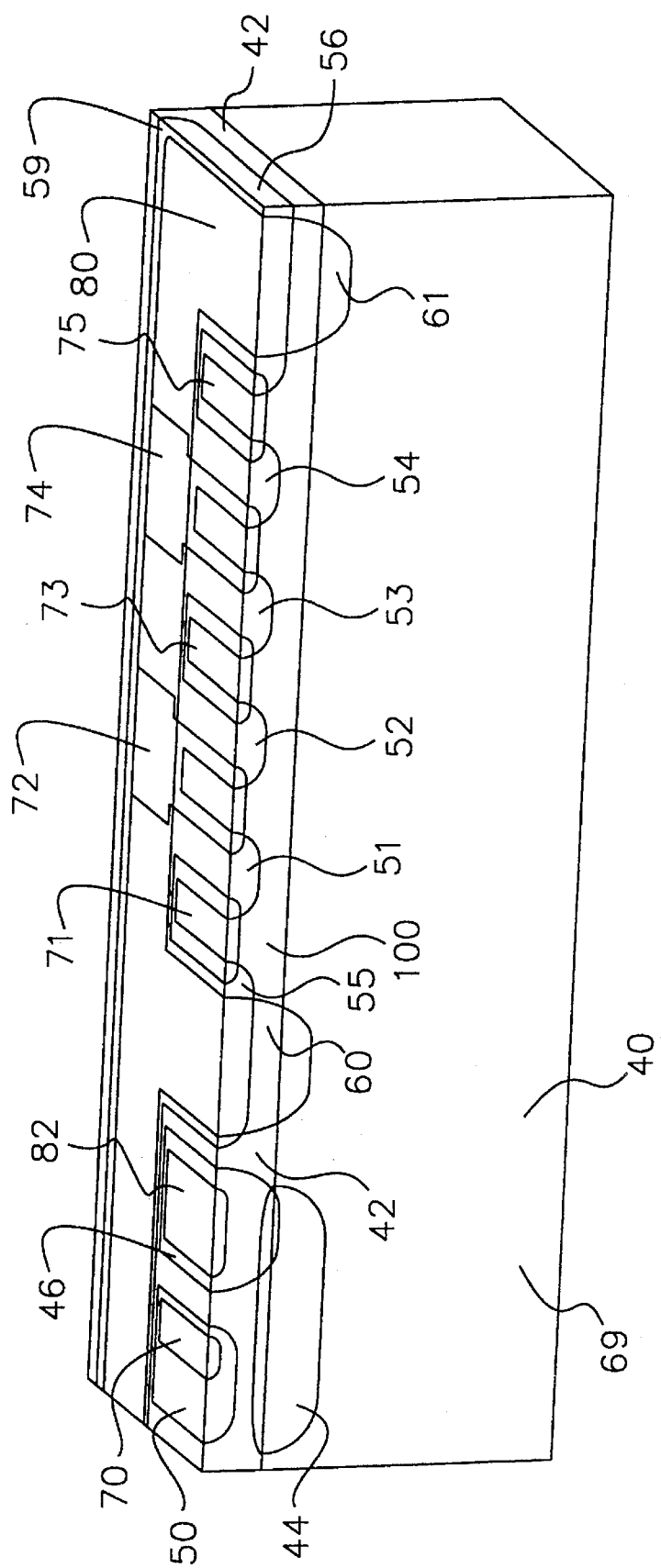
FIG. 5 is a perspective sectional view of the device shown in FIG. 4.

FIG. 5 is a perspective view of the device shown in FIG. 4. It should be understood that the section taken through the present invention, to form surface 69 in FIGS. 4 and 5, is taken through the center of the Hall effect element. It should therefore be understood that the section of the device removed for the purpose of providing the views of FIGS. 4 and 5 is generally symmetrical with the illustrated views in those Figures. Therefore, the sizes of the depositions illustrated in those Figures are approximately half of their actual sizes and configurations.

In FIG. 5, it can be seen that the isolation diffusions, 60 and 61, are part of a much larger deposition that is identified by reference numeral 80. It should also be understood that this isolation diffusion extends around the Hall effect region 100. In combination with the substrate 40 and an oxide layer which is not shown in FIG. 5, the isolation diffusion 80 defines the Hall effect region 100. It can also be seen that the base diffusion that is used to provide the diffusions identified by reference numerals 51–56 is a contiguous position defining diffusion that has a plurality of openings formed therein. Those openings, or windows, in the position defining diffusion are advantageously used by the present invention to provide areas where the epitaxial material remains undiffused after the step of depositing the base diffusion 50. This undiffused epitaxial material can then later be doped during the process of forming the emitter diffusion 70–76. If the exposed regions of the epitaxial layer are doped with an appropriate impurity to form contact diffusions, the sizes and shapes of those contact diffusions will be accurately determined by the sizes and shapes of the openings within the position defining diffusions 51–56. As long as the diffusions identified by reference numerals 71–75 are deposited within the openings of the position defining diffusion 51–56, their sizes and shapes will be accurately determined by the edges of those openings if the defining diffusions are deeper than the contact diffusion. The transistor base and emitter diffusions satisfy this depth condition. In addition, the sizes and shapes of the contact diffusions can be further minimized by increasing the diffusions of the position defining diffusion process. In FIG. 5, the base diffusion is identified by reference numerals 51–56 and is shown as one contiguous position defining diffusion. All of the critical positions of the present invention are defined by the contiguous based diffusion 51–56. The base diffusion is also identified by reference numeral 59 in FIG. 7.

Figure 6:
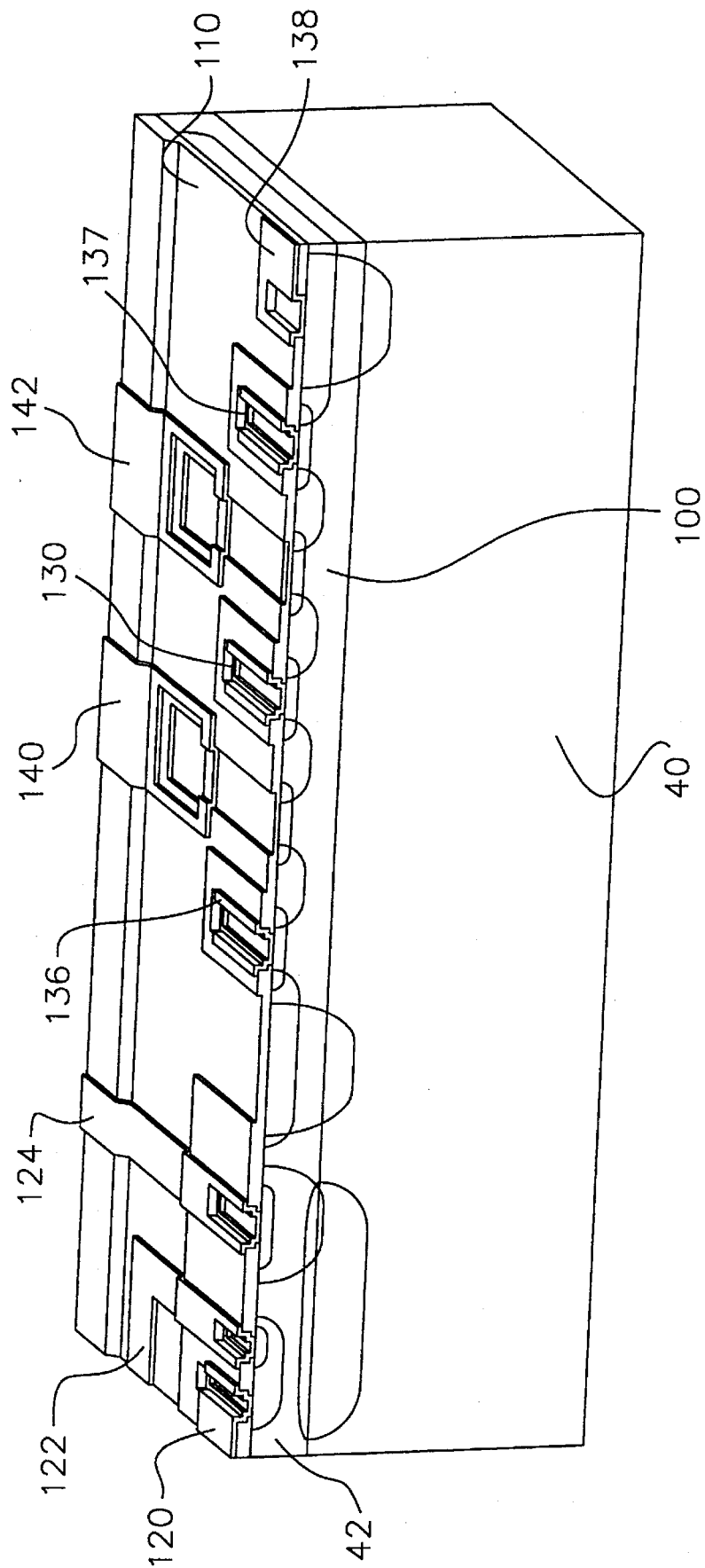
FIG. 6 is a view of the device shown in FIG. 5, but with oxide layers and metallic contacts disposed on the epitaxial layer.

FIG. 6 shows the section view that is illustrated in FIG. 5, but with an oxide layer 110 and a plurality of metallic contacts provided to facilitate electrical connection between the various contacts of the vertical Hall element and the transistor described above in conjunction with FIG. 5. The oxide layer 110, shown in FIG. 6, has three different thickness' that result from the processes during which the oxide layer is grown. The thickest oxide layer is located over the isolation, sinker and epitaxial layer. The middle thickness oxide is located over the based diffusion and the thinnest oxide layer is located over the emitter diffusion. This result is generally known and understood by those skilled in the art. The oxide layer 110, in a preferred embodiment of the present invention, is silicon dioxide and the metallic connections are aluminum. With reference to FIGS. 5 and 6, the metallic contact identified by reference numeral 120 is disposed in electrical communication with the base diffusion which is identified by reference numeral 50 in FIG. 5. The metallic contact identified by reference numeral 122 is disposed in electrical communication with the emitter diffusion 70 and the metallic contact identified by reference numeral 124 is in electrical communication with the contact diffusion 82 that is provided to facilitate the electrical communication between metallic contact 124 and the sinker 46 and buried layer 44. The metallic contacts, 120, 122 and 124, form the connections to the transistor that is formed simultaneously with the contact diffusions of the vertical Hall element.

With continued reference to FIGS. 5 and 6, the metallic contact identified by reference numeral 130 is the current source which provides the electrical current flow through the Hall effect region 100. Metallic contacts 136 and 137 are connected to a circuit point of ground potential. The metallic contact identified by reference numeral 138 connects the isolation diffusion to a circuit point of ground potential. The metallic contacts identified by reference numerals 140 and 142 are connected in electrical communication with the contact diffusions, 72 and 74, respectively. It should be noted that the offset in spacing of metallic contacts 140 and 142 from the other three metallic contacts of the Hall effect element is necessitated by the close spacing of the contact diffusions, 71–75, and the size required for the minimum metallic contact dimension. It should also be understood that all of the metallic contacts shown in FIG. 6 extend away from the sectioned portion of the semiconductor device illustrated in the figure and provide electrical communication between the contact diffusions shown in FIG. 6 and other components on a common wafer. It should further be understood that the Hall effect element and the transistor shown in FIG. 6 are processed simultaneously with many other components of an integrated circuit and with many other integrated circuits on a common wafer. These processing steps are well known to those skilled in the art.

It should also be understood that the shapes and sizes of the contact diffusions, isolation diffusions, sinkers and buried layers illustrated in FIGS. 4–7 are not intended to represent precise dimensional relationships or accurately depicted shapes of diffusion regions. It should be recognized that the figures are not drawn to scale but, instead, are intended to describe the basic configuration of the present invention so that its structure and method of manufacture can be readily understood. For purposes of clarity, many of the dimension relationships of the diffusions, epitaxial layers oxide layer and metallic contacts are distorted.

Figure 7:
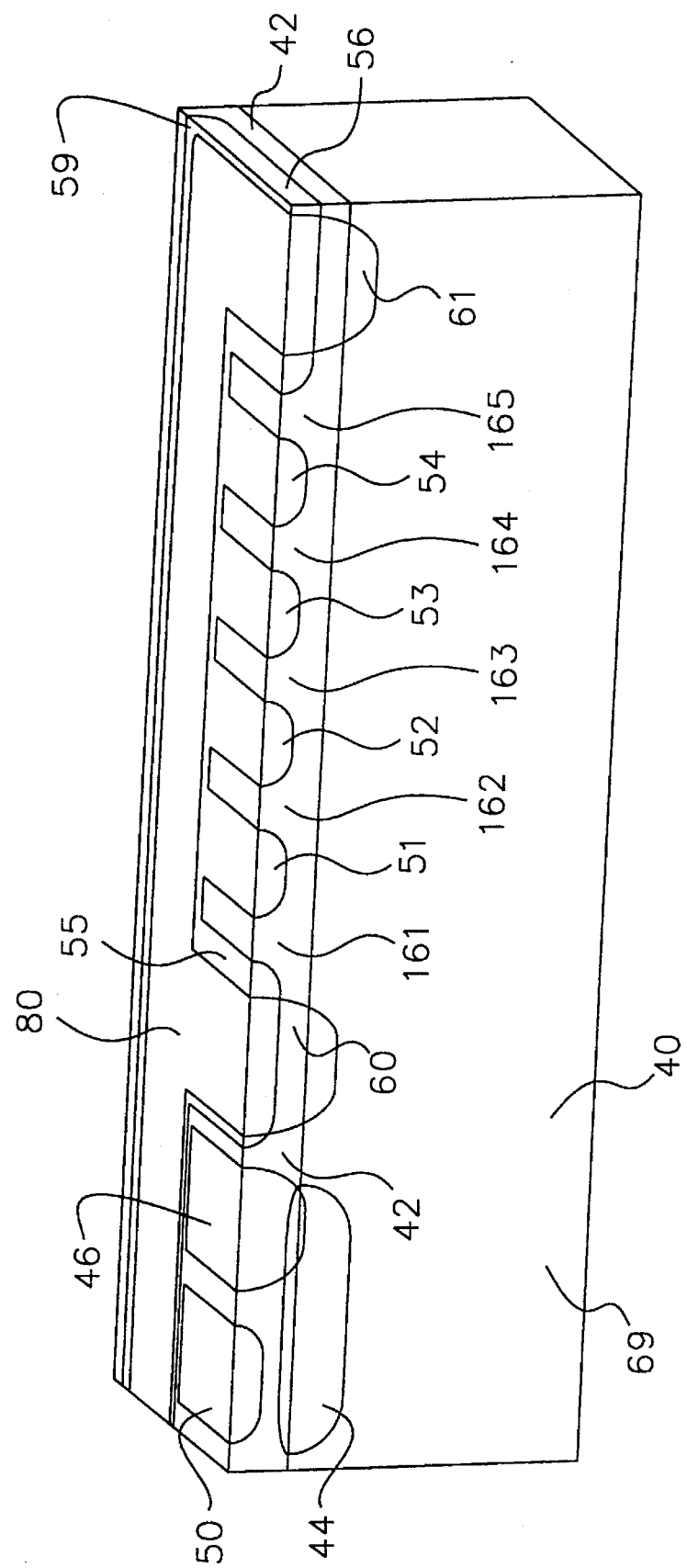
FIG. 7 is a partial view of the present invention with dimension notation provided.

FIG. 7 is provided to show the relationship between the position defining diffusion 51–56 and the openings formed therein for the purpose of defining the positions where the contact diffusions will later be deposited and diffused into the epitaxial layer 42. As is well known to those skilled in the art, the manufacture of semiconductor components requires the sequential application of many process steps. FIG. 7 is intended to show the configuration of the device following the deposition of the position defining diffusion 59. In the sectional views of the semiconductor device, the diffusions identified by reference numerals 51–54 appear in the section views to extend from the main body of the diffusion 59 in a peninsular manner. However, it should be understood that the shape of the position defining diffusion 59 also comprises a mirror image of its portion shown in the figures. As a result, the regions identified by reference numerals 161–165 are openings formed in the position defining diffusion 59 which are entirely surrounded by the position defining diffusion. The sizes and shapes of these openings, 161–165, are defined by the position defining diffusion 59. Also shown in FIG. 7, for purposes of reference, are the base diffusion 50, the sinker 46, the buried layer 44 and the isolation diffusion that is identified by reference numerals 60, 61 and 80. The position defining diffusion 59 also comprises the portions identified by reference numerals 55 and 56 which serve as a capping layer over the isolation diffusion to compensate for the dilution of the impurities near the epitaxial surface when the isolation diffusion is deeply diffused through the epitaxial layer.

The processing steps that can be used to manufacture a vertical Hall element made in accordance with the present invention can vary in specific procedure or sequence. However, for purposes of more clearly describing a preferred embodiment of the present invention, a sequence of processing steps will be described in conjunction with FIGS. 4–7. Initially, a substrate 40 of a material with a P type conductivity is provided. Typically, this material is silicon with an acceptor concentration of approximately $10^{15}$ per cubic centimeter. On the upper surface of the substrate, an oxide layer of silicon dioxide is grown and etched to define a particular pattern. One of the openings in the oxide layer defines the shape of the buried layer 44. A deposition of $N^+$ type conductivity material is provided. Typically, the dopant for the buried layer 44 can be antimony. The antimony is then driven more deeply into the substrate by diffusion and the oxide is regrown over the etched opening in the oxide layer. This regrowth will typically deplete a portion of the silicon in the region of the original etched opening. However, this slight depression caused by the depletion of the silicon is not specifically illustrated in the figures. As is well known to those skilled in the art, this depletion of silicon can form a pattern that is used in later masking steps during the production of the semiconductor components.

Following the steps described above, the oxide layer is completely removed from the silicon wafer by a wet etching process. Then an N type epitaxial layer 42 is grown on the upper surface of the P type substrate 40. The epitaxial layer is identified by reference numeral 42 in the Figures. The N type epitaxial layer typically has a donor concentration approximately equal to two times $10^{15}$ per cubic centimeters. An oxide is grown over the N type epitaxial layer. Using the pattern formed by the silicon depletion that was described above in conjunction with the formation of the buried layer, a pattern is etched in the oxide layer to define a $P^+$ deposition which forms the isolation layer. Typically, this deposition comprises boron. The isolation diffusion region is identified by reference numerals 60, 61 and 80 in the figures. The boron deposition is diffused so that it extends downward completely through the epitaxial layer and into the P type substrate. Then the silicon dioxide is regrown over the etched openings that were used during the isolation diffusion process. The oxide is again etched to define the opening through which the sinker 46 will be deposited and diffused. The sinker deposition, which is typically phosphorous, is an $N^+$ material which is identified by reference numeral 46. The sinker 46 is accurately aligned to the isolation diffusion through the normal procedures and sequences that are well known to those skilled in the art and used in the manufacture of semiconductive devices. The $N^+$ sinker is diffused until it overlaps the buried layer 44. After this diffusion is complete, the oxide is regrown over the etched openings. In certain semiconductor processes, all of the oxide is removed from the surface of the wafer at this step and a new thermal oxide is grown which has a uniform thickness over the epitaxial layer, the sinker and the isolation regions. This type of oxide configuration is shown in FIG. 6. However, it should also be understood that other semiconductor manufacturing processes differ in this regard. Different processing steps will lead to different oxide thickness over the epitaxial layer, the sinker, the isolation diffusion, the base diffusion and the emitter diffusion to result in five different thickness' of oxide layer. This is not specifically illustrated in FIG. 6, but it should be understood that this type of result could be caused by the specific sequence of process steps used to manufacture the device. The specific size and configuration of the oxide layer is a function of the processing steps and do not limit the present invention in any way.

Following the steps described above, the oxide of silicon is etched to define an opening that will be used to deposit and diffuse the base of a transistor. The base diffusion 50 is shown in the Figures and typically comprises a P type diffusion of boron. This base diffusion is accurately aligned to the isolation diffusion through the use of appropriate and well known masking and positioning techniques. The boron base diffusion is then diffused to its proper depth and the oxide is again regrown over the openings that were used for the base diffusion. The oxide is then etched again to define the N+ phosphorous or arsenic emitter diffusion 70. The phosphorous or arsenic is disposed in the etched opening and diffused to its proper depth. It should be understood that the emitter diffusion 70 has a depth which is less than the depth of the base diffusion 50. It should further be understood that the position defining diffusion identified by reference numerals 51–56 and 59 are made simultaneously with the base diffusion 50. In addition, it should be understood that the contact diffusions identified by reference numerals 71–75 are made simultaneously with the emitter diffusion 70. This allows the normal processing steps required for the manufacture of a transistor to be used to simultaneously produce a vertical Hall element that has improved accuracy as a result of the precise positioning made possible by these techniques.

After the emitter is diffused to the proper depth, the oxide is regrown over the etched opening. The emitter diffusion 70 is accurately aligned with the base diffusion 50 because of the masking alignment techniques typically used in the manufacture of integrated circuits. After the steps described above are completed, the silicon dioxide layer is opened at selected locations by etching through the oxide layer where electrical contact is required. In other words at the emitter, the base and the sinker of the transistor, etched openings are provided so that a metallic layer can later be deposited in electrical communication with the contact diffusions. In addition, the oxide is etched to allow the isolation diffusion to be similarly connected to a metallic contact. Metal, such as aluminum, is then evaporated over the entire wafer surface. The pattern of metal is then etched away at preselected locations to leave the metal traces where desired. These metal traces are identified by reference numerals 120, 122, 124, 130, 136, 137, 138, 140 and 142 in FIG. 6. The metal etching process is aligned to the emitter.

With reference to the processing steps described above, several important characteristics can be seen. First, no additional masking steps are required to produce the vertical Hall element. Instead, the vertical Hall element is produced by merely providing additional regions of the mask which are particularly shaped to define the patterns of the isolation diffusion, the base diffusion and the emitter diffusion. During the normal steps used to produce the transistor, the Hall effect element can be manufactured in a manner which accurately places its contact diffusions at their required locations relative to the region of Hall effect material 100 and the other contact diffusions.

Figure 8:
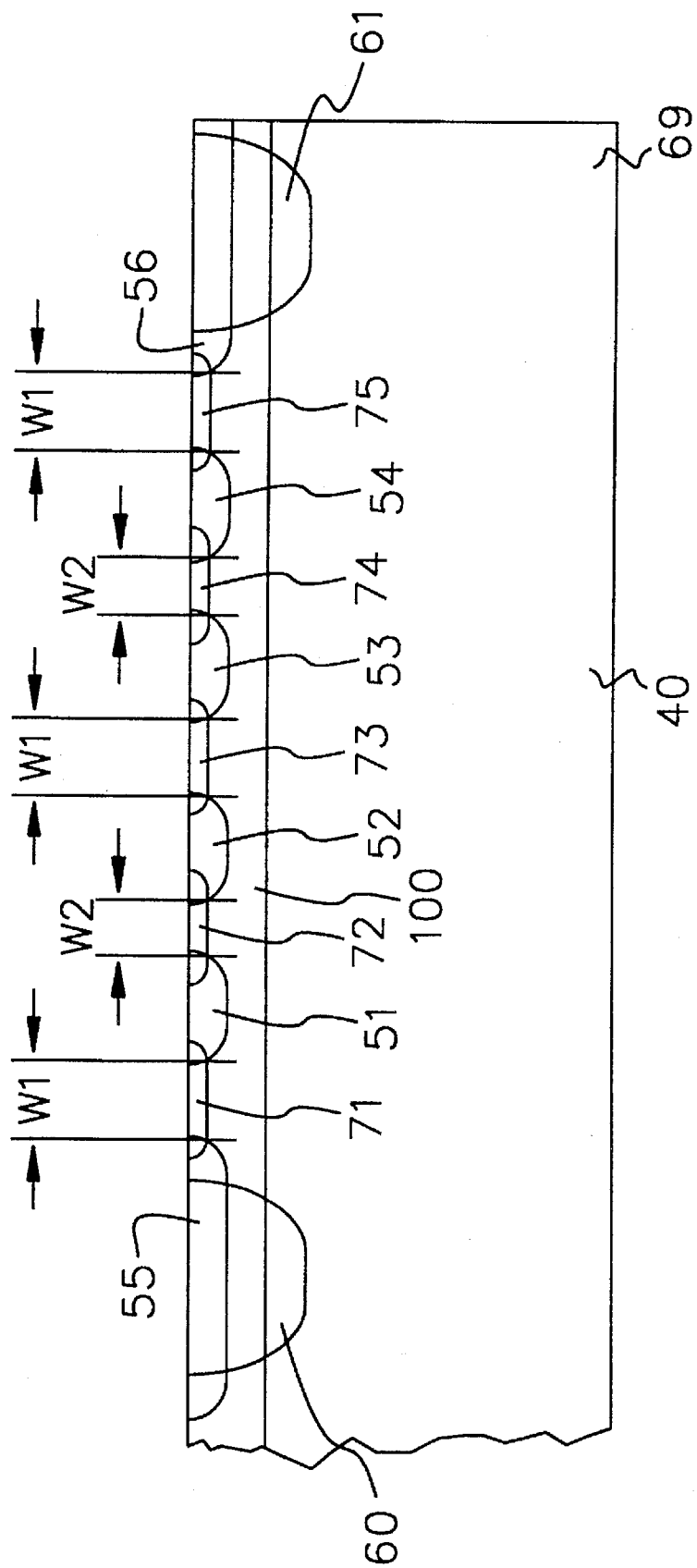
FIG. 8 is a section of the illustration of FIG. 7 which identifies certain important dimensions with regard to the Hall element.

FIG. 8 is a sectional view of the component described and illustrated above in conjunction with FIGS. 4–7. However, in FIG. 8, only the Hall effect element is illustrated. The portions of the epitaxial layer that are used to manufacture the transistor are not shown. In FIG. 8, it can be seen that the contact diffusions identified by reference numerals 71, 73 and 75 have a width that is identified as W1. The contact diffusions identified by reference numerals 72 and 74 have a width identified as W2. As described above, it is important to minimize the magnitude of dimension W2. Ideally, the contact diffusions for the sensing contacts of the Hall device should be point contacts in a theoretical sense. The size of the sense contacts determines the source impedance of the Hall element as it drives the inputs of the first differential amplifier stage associated with the Hall element. A point sense contact to the Hall element would give an infinite source impedance and any DC base current of the first stage amplifier would product an infinite offset voltage. Most known horizontal Hall elements have all four contacts the same size with the result that the resistance between the current carrying contacts is the same as the resistance between the sense contacts. However, this may not always be a requirement for proper operation of the device. The sensor contacts can be significantly smaller than the current carrying contacts and still be sufficiently small to handle the next stage. The smaller that the sensor contacts are made, the closer $G_s$ gets to unity and the magnetic sensitivity is increased. If the sensor contacts are made too small, the offset is increased and the signal-to-offset ratio decreases. As a result, the optimum size for the sense contacts it is not necessarily a point contact as could be assumed in the academic sense because of the practice problems associated with an attempt to achieve this minimal size. Although achieving a point contact is not practically feasible, it is important to optimize the magnitude of dimension W2. The reasons for this requirement relates to the shorting factor that is described above and addressed more completely as the geometrical correction factor in the Popovic reference from pages 165 through 170. By using the techniques described above, which simultaneously deposit and diffuse the position defining diffusion at the same time as the base diffusion and simultaneously deposits and diffuses the contact diffusions of the vertical Hall element at the same time as the emitter diffusion, dimension W2 in FIG. 8 can be minimized and accurately located. The magnitude of dimension W2 can be reduced as a result of the diffusion of the position defining diffusion which further reduces the effective magnitude of W2. It should be understood that the sizes of the contact diffusions, 71–75, are not solely determined by the sizes of the etched openings in the oxide layer prior to their depositions. More precisely, the effective size of these contact diffusions are determined by the locations and sizes of the base diffusions that form the position defining diffusion. These regions are identified by reference numerals 51–56 in FIG. 8. If these position defining diffusions are properly located and their size is properly determined by the diffusion process, the remaining space between the individual position defining diffusions will define the size and location of the contact diffusions. In FIG. 8, the dimension lines used to define the magnitudes of dimensions W1 and W2 extend through the intersection of the position defining diffusions and the contact diffusions. The effective magnitude of these dimensions, W1 and W2, are determined by the space between the position defining diffusions. Therefore, the accuracy in both the position and size of the contact diffusions are a direct function of the accuracy in the positioning of the position defining diffusions. The openings, or windows, formed in the position defining diffusion will determine the size and accuracy of each of the contact diffusions. This is another significant benefit of the present invention. The accuracy of the size and location of the contact diffusions can be determined by the accuracy of the position defining diffusion. In addition, since this position defining diffusion is made at the same time as the base diffusion of the transistor, the normally high accuracy of the processes can be used advantageously. This advantage of the present invention is in addition to the advantage of not requiring additional processing steps.

Figure 9:
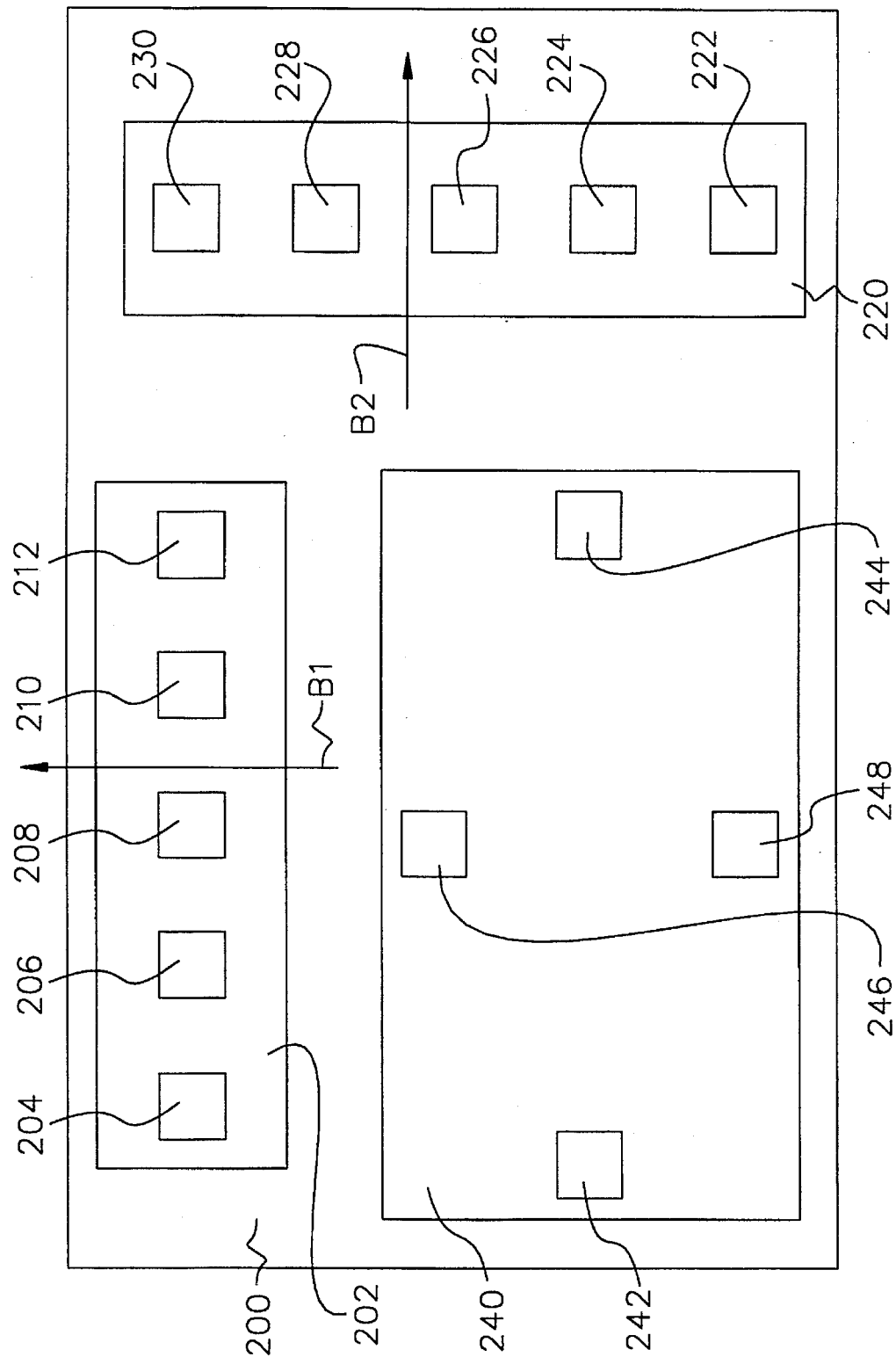
FIG. 9 is a top view of a semiconductor device comprising two vertical Hall elements made in accordance with the present invention in combination with a conventional horizontal Hall element.

The ability to accurately manufacture a vertical Hall element that has similar accuracy and sensitivity to horizontal Hall elements in an important advantage that can be utilized in many applications. For example, since a vertical Hall element senses the magnitude of a magnetic field within the plane of the epitaxial layer, two vertical Hall elements can be located perpendicularly to each other in a common epitaxial layer so that the magnitudes of a magnetic field can be measured in two directions that are perpendicular to each other. In many applications, this is a significant advantage. FIG. 9 is a top view that shows a common epitaxial layer 200. It should be understood that FIG. 9 is highly exemplary and intended to show relative positions and locations of Hall effect elements. It is not intended to accurately depict the actual structure of an integrated circuit or a semiconductor component. The lines in FIG. 9 are intended to define location and spacing.

A first vertical Hall element 202 is shown with its contacts, 204, 206, 208, 210 and 212. These contacts are shown as square metallic depositions, but it should be understood that in a typical integrated circuit arrangement, the metallic contacts would extend away from the Hall effect element 202 and provide electrical connection with other components. The boxes used for these purposes in FIG. 9 are merely intended to show the location of the contact diffusions. The second vertical Hall element 220 is shown with its contacts identified by reference numerals 222, 224, 226, 228 and 230. As can be seen in FIG. 9, the positions of the two vertical Hall elements, 202 and 220, are perpendicular to each other. Therefore, they will be sensitive to magnetic fields in directions that are perpendicular to each other. These components of the magnetic field are identified as B1 and B2 in FIG. 9.

Because the vertical Hall elements are contained within a common epitaxial layer, a standard horizontal Hall element can also be provided in that same epitaxial layer according to techniques that are well known to those skilled in the art. The horizontal Hall element 240 is shown with contacts 242 and 244 that would be typically used to provide a current flowing through the Hall element. The other two contacts, 246 and 248, are provided for the purpose of measuring the voltage potential across the Hall element. In a manner that is well known to those skilled in the art, the horizontal Hall element 240 could be used to measure the magnitude of a magnetic field extending perpendicular to the sensing plane of the Hall element which is the epitaxial layer. In other words, the horizontal Hall element 240 would measure the magnitude of a magnetic field extending perpendicular to FIG. 9. As a result, the arrangement of two vertical Hall elements, 202 and 220, in combination with a horizontal Hall element 240 permits the sensing of all three components of a magnetic field simultaneously. Since all of these Hall elements can be manufactured in a common epitaxial layer, the normal problems associated with temperature compensation and other variations will be eliminated or significantly reduced because of the fact that all three Hall elements are made of the same material within the same epitaxial layer.

Certain applications of Hall effect elements require the ability to provide a quadrature measurement of a changing magnetic field. This quadrature measurement can be provided by a single vertical Hall element combined with a single horizontal Hall element. From the description above in conjunction with FIG. 9, it can be seen that the vertical Hall element 202 could be combined with the horizontal element 240 to perform this task.

The vertical Hall element responds to the component of the magnetic field which lies within the epitaxial layer and which is parallel to the surface of the semiconductor chip. As discussed above, a vertical Hall element can be used in combination with a horizontal Hall element to form a quadrature Hall sensor in a single die. The vertical Hall element of the present invention is constructed entirely of layers and diffusions that currently exist in the manufacturing processes necessary to produce integrated circuits. The magnetically responsive material of the Hall element is the N type epitaxial layer which is the same layer that would normally be used to manufacture a horizontal Hall element. Therefore, the temperature characteristics of vertical Hall elements and horizontal Hall elements made in the same epitaxial layer will be generally identical to each other. The vertical Hall element made in accordance with the present invention comprises two mirror image portions formed in a common region of an N type epitaxial material that is electrically isolated from the remaining portions of the silicon chip by P-N junctions. The positive polarity current carrying element of the Hall element is an N+ emitter diffusion located at the center of the Hall effect region within the N type epitaxial layer. The two negative polarity contacts, or ground potential contacts, are determined by the N type emitter diffusions near the two ends of the Hall effect region of the epitaxial layer. The two negative polarity current carrying contacts are connected by a metal conductor. These metallic conductors are disposed in electrical communication with the contact diffusions at their central regions where the oxide layer has been removed. The Hall effect region of the epitaxial layer that forms the two portions of the vertical Hall element is surrounded by the P type substrate at its bottom surface and the P type isolation diffusions around its sides. The isolation diffusion is capped with the P type base diffusion. All of these isolation diffusions are connected to circuit ground. The two negative polarity, or ground, contacts of the Hall element are junction isolated from the P type conductivity layers. Therefore, they can be biased at virtually any voltage equal to or more positive than the circuit ground potential. This makes it possible to bias the vertical Hall element with the same voltage potentials that are used on the well known horizontal Hall element. Integrated circuit manufacturing processes are designed such that the N type emitter diffusion has a depth which is less than the P type base diffusion. One of the features of the present invention is the use of this difference in depth of the N type emitter and the P type base diffusions to precisely locate the areas of contact between the emitter diffusions, or contact diffusions and the N type epitaxial layer. This precise location is provided by openings that are formed in the P type base diffusion where contact with the Hall effect element is desired. Since all of these openings are located in the same base layer photomask, they will be accurately aligned to each other within the accuracy capabilities of the photomask. Therefore, even through the N type emitter diffusions may be misaligned relative to the base mask, the actual areas of contact are defined by the openings in the base mask. The result of this process is the precise relative location of the contacts on the body of the N type Hall element.

Because of the mirror image construction, the currents in the two halves of the Hall element flow in the same axis, but in opposite directions. When these two matched N type resistors are subjected to a component of magnetic field that is parallel to the surface of the die and within the epitaxial layer, a Hall voltage will develop between the top and bottom edges of each of these two resistors. Since the electrical currents are flowing in opposite directions in the two resistors, the Hall voltages will be of opposite polarity with respect to the geometry of the Hall element. In particular, the top edge of one of the resistors will become more positive and the top edge of the other resistor will become more negative in response to a magnetic field parallel to the surface of the epitaxial layer and perpendicular to the axis of current flow. Because of the structure of the device, it is not practical to contact the bottom edge of either of the two resistors. However, the Hall voltage can be sensed by measuring the difference in voltage at the top edges at mirror image points on the two resistors. Because of the geometry of the device and the nature of the Hall effect, the Hall voltage measured in this way is solely the result of the component of magnetic field that is both parallel to the surface of the die and perpendicular to the axis of current flow in the N type epitaxial resistors.

As described above, two vertical Hall elements can be fabricated at 90 degrees to each other in order to sense orthogonal components of the magnetic field parallel to the surface of the die. It also follows that the two orthogonal Hall elements and an additional horizontal Hall element can be used to resolve an arbitrarily directed magnetic field into three orgothonal components. A particularly important feature of the present invention relates to the technique used to form the sensing contacts. In the conventional Hall element, both the current carrying contacts and the sensing contacts on the N type epitaxial layer are made with the N emitter diffusion. The horizontal Hall element is typically symmetrical with all four N type contacts having the same diameter. This arrangement works well for the horizontal Hall element. However, in the vertical Hall element the situation is significantly different. The relatively thin N type epitaxial layer, which is typically about 9.0 micrometers, and the minimum allowed dimension of the N type emitter diffusion, which is approximately 9.0 micrometers, can result in a significant reduction in magnetic sensitivity because of the shorting factor and geometry of the vertical Hall element. By properly sizing the openings in the base layer photomask, it is possible to control the N type contact diffusions so as to match the electrical geometry and shorting factor of the vertical Hall element to the more familiar horizontal Hall element.

For the horizontal Hall element, the four N type contact diffusions result in a total shorting factor $G_t$ of approximately 0.815 with a length-to-width ratio of 2.1. Simulations have shown that the shorting affect of the contacts is the same for current carrying contacts and sense contacts having the same effective length-to-width ratio. Therefore, the shorting factor for one contact $G_1$ is approximately equal to 0.950 and the shorting factor for the pair of sense contacts $G_2$ is approximately 0.903. For a horizontal Hall element, the Hall voltage is defined by equation 1.

$$V_h = V_a B_\perp \mu_h [G_t(W/L)] \qquad (1)$$

where $V_h$ is the Hall voltage in the horizontal Hall element, $V_a$ is the DC voltage applied to the Hall element, $B_\perp$ is the component of magnetic field perpendicular to the sensing plane of the Hall element, $\mu_h$ is the Hall mobility, $G_t$ is the contact geometry shorting factor and W/L is the effective width-to-length ratio of the Hall element. It should be noted that the expression for the Hall voltage of the horizontal Hall element is independent of the thickness of the N type epitaxial layer. For the horizontal Hall element, the expression within the bracket of equation 1 is generally equal to 0.388.

The corresponding equation for the Hall voltage of a vertical Hall element is shown in equation 2.

$$V_v = V_a B_= \mu_h [G_t(T/L)] \tag{2}$$

where $V_v$ is the Hall voltage in the vertical Hall element, $B_=$ is the component of magnetic field parallel to the surface and perpendicular to the axis of current flow and T/L is the effective thickness-to-length ratio of the vertical Hall element. The expression for the Hall voltage of the vertical Hall element is independent of the width of the N type epitaxial layer. Using minimum process dimensions, the effective length-to-thickness ratio of the current carrying contacts of a vertical Hall element is about 2.24 and the shorting factor produced by the current carrying contacts is approximately 0.958. The length of the sensing contacts in the direction of current flow is approximately 2.8 micrometers after the processing is complete. However, for an applied voltage of 4.0 to 5.0 volts on the vertical Hall element, the sense contacts will be at a voltage of 2.0 to 2.5 volts which is reverse biased on the P-N junction between the N type Hall element and the surrounding P type material. This reverse bias causes the N type epitaxial layer to be depleted of electrons to a depth of approximately 1.0 micrometers on each edge of the sense contacts.

$$V_v = V_a \mu_h B_= (T/L)_c G_c G_s \tag{3}$$

Combining the shorting factors for the two current carrying contacts and the sense contact provides a total shorting factor for the vertical Hall element of approximately 0.937. This results in the bracketed portion of equation 2 being generally equal to 0.388. This implies that the magnetic sensitivity of the vertical Hall element can be made to be equivalent to a normal horizontal Hall element at the same bias voltage. Even through the Hall voltage of the vertical Hall element is independent of the width of the N type epitaxial layer, the width is important in determining the total resistance of the Hall element. When the length-to-width ratio of the vertical Hall element is made the same as the horizontal Hall element, the resistances of the two components are equal. For the vertical Hall element described above, the length-to-thickness ratio is approximately 2.42 while the horizontal Hall element has a length-to-width ratio of approximately 2.1. In addition, the penetration of the P type base cap and depletion region reduces the N type epitaxial layer thickness to approximately 8.5 micrometers in the vertical Hall element compared to 10.5 micrometers in the horizontal Hall element. The resistance values of both the vertical and horizontal Hall elements will be equal when the vertical Hall element is configured such that its width-to-thickness ratio is equal to 1.42. If the biased epitaxial layer thickness is 8.5 micrometers, the width of the vertical Hall element will be 12.1 micrometers in order to achieve the same resistance as a dual horizontal Hall element. The vertical Hall element consists of a mirror image pair of N type epitaxial resistors. As a result, one vertical Hall element can be designed to draw the same bias current and have the same magnetic sensitivity as a dual horizontal Hall element. The horizontal Hall element will respond to the component of magnetic field that is perpendicular to the surface of the die while the vertical Hall element will respond only to the component of magnetic field that is in the plane of the surface of the die and perpendicular to the axis of current flow.

Although the present invention has been described in particular detail and illustrated with specificity relating to a preferred embodiment of the present invention, it should be understood that alternative embodiments are also within its scope.

The embodiments of the invention in which an exclusive property or right is claimed are defined as follows:

1. An integrated circuit with a vertical Hall element, comprising:

a substrate comprising a material of a first conductivity type;

an epitaxial layer disposed on a first surface of said substrate, said epitaxial layer comprising a material of a second conductivity type;

a transistor base diffusion within said epitaxial layer, said transistor base diffusion having a depth of a first magnitude, said transistor base diffusion comprising a material of said first conductivity type;

a transistor emitter diffusion within said epitaxial layer, said transistor emitter diffusion having a depth of a second magnitude, said second magnitude being less than said first magnitude, said transistor emitter diffusion comprising a material of said second conductivity type;

means for isolating a Hall effect region of said epitaxial layer;

a position defining diffusion comprising a material of said first conductivity type, said position defining diffusion having first, second, third, fourth and fifth openings formed therein, said position defining diffusion being diffused within said epitaxial layer simultaneously with said transistor base diffusion, said first, second, third, fourth and fifth openings being disposed within said Hall effect region;

first, second, third, fourth and fifth contact diffusions comprising a material of said second conductivity type and being diffused within said first, second, third, fourth and fifth openings, respectively, within said epitaxial layer simultaneously with said transistor emitter diffusion, said first, second, third, fourth and fifth contact diffusions being disposed within said Hall effect region;

first means for connecting said third contact diffusion to a first terminal of a power supply circuit;

second means for connecting said first and fifth contact diffusions to a second terminal of said power supply circuit; and third means for connecting said second and fourth contact diffusions to a means for measuring a voltage differential.

2. The integrated circuit of claim 1, wherein:

said isolating means comprises a diffusion of a material of said first conductivity type extending from a surface of said epitaxial layer to said substrate.

3. The integrated circuit of claim 1, wherein:

said first conductivity type material is P type material and said second conductivity type material is N type material.

4. The integrated circuit of claim 1, wherein:

said first connecting means comprises a metallic layer.

5. The integrated circuit of claim 1, wherein:

said second connecting means comprises a metallic layer.

6. The integrated circuit of claim 1, further comprising:

a buried layer of said second conductivity type diffused into said substrate and said epitaxial layer; and a sinker diffusion of said second conductivity type extending through said epitaxial layer and into said substrate, said sinker diffusion and said buried layer being disposed in contact with each other.

7. The integrated circuit of claim 1, wherein:

said transistor base diffusion comprises boron.

8. The integrated circuit of claim 1, wherein:

said transistor emitter diffusion comprises phosphorous.

9. The integrated circuit of claim 1, wherein:

the lateral dimensions of said second and fourth contact diffusions are reduced by the diffusion of said position defining diffusion to reduce the size of said second and fourth openings prior to deposition of said second and fourth contact diffusions.

10. An integrated circuit with a vertical Hall element, comprising:

a substrate comprising a material of a first conductivity type;

an epitaxial layer disposed on a first surface of said substrate, said epitaxial layer comprising a material of a second conductivity type;

a transistor base diffusion within said epitaxial layer, said transistor base diffusion having a depth of a first magnitude, said transistor base diffusion comprising a material of said first conductivity type;

a transistor emitter diffusion within said epitaxial layer, said transistor emitter diffusion having a depth of a second magnitude, said second magnitude being less than said first magnitude, said transistor emitter diffusion comprising a material of said second conductivity type;

means for isolating a Hall effect region of said epitaxial layer, said isolating means comprise a diffusion of a material of said first conductivity type extending from a surface of said epitaxial layer to said substrate;

a position defining diffusion comprising a material of said first conductivity type, said position defining diffusion having first, second, third, fourth and fifth openings formed therein, said position defining diffusion being diffused within said epitaxial layer simultaneously with said transistor base diffusion, said first, second, third, fourth and fifth openings being disposed within said Hall effect region;

first, second, third, fourth and fifth contact diffusions comprising a material of said second conductivity type and being diffused within said first, second, third, fourth and fifth openings, respectively, within said epitaxial layer simultaneously with said transistor emitter diffusion, said first, second, third, fourth and fifth contact diffusions being disposed within said Hall effect region;

first means for connecting said third contact diffusion to a source of power;

second means for connecting said first and fifth contact diffusions to a point of ground potential; and third means for connecting said second and fourth contact diffusions to a means for measuring a voltage differential.

11. The integrated circuit of claim 10, wherein:

said first conductivity type material is P-type material.

12. The integrated circuit of claim 10, wherein:

said second conductivity type material is N-type material.

13. The integrated circuit of claim 10, wherein:

said first connecting means comprises a metallic layer.

14. The integrated circuit of claim 10, wherein:

said second connecting means comprises a metallic layer.

15. The integrated circuit of claim 10, further comprising:

a buried layer of said second conductivity type diffused into said substrate and said epitaxial layer; and a sinker diffusion of said second conductivity type extending through said epitaxial layer and into said substrate, said sinker diffusion and said buried layer being disposed in contact with each other.

16. The integrated circuit of claim 10, wherein:

said transistor base diffusion comprises boron.

17. The integrated circuit of claim 10, wherein:

said transistor emitter diffusion comprises arsenic.

18. The integrated circuit of claim 10, wherein:

the lateral dimensions of said second and fourth contact diffusions are reduced by the diffusion of said position defining diffusion to reduce the size of said second and fourth openings prior to deposition of said second and fourth contact diffusions.

19. An integrated circuit with a vertical Hall element, comprising:

a substrate comprising a material of a first conductivity type;

an epitaxial layer disposed on a first surface of said substrate, said epitaxial layer comprising a material of a second conductivity type;

a transistor base diffusion within said epitaxial layer, said transistor base diffusion having a depth of a first magnitude, said transistor base diffusion comprising a material of said first conductivity type;

a transistor emitter diffusion within said epitaxial layer, said transistor emitter diffusion having a depth of a second magnitude, said second magnitude being less than said first magnitude, said transistor emitter diffusion comprising a material of said second conductivity type;

means for isolating a Hall effect region of said epitaxial layer, said isolating means comprise a diffusion of a material of said first conductivity type extending from a surface of said epitaxial layer to said substrate;

a position defining diffusion comprising a material of said first conductivity type, said position defining diffusion having first, second, third, fourth and fifth openings formed therein, said position defining diffusion being diffused within said epitaxial layer simultaneously with said transistor base diffusion, said first, second, third, fourth and fifth openings being disposed within said Hall effect region;

first, second, third, fourth and fifth contact diffusions comprising a material of said second conductivity type and being diffused within said first, second, third, fourth and fifth openings, respectively, within said epitaxial layer simultaneously with said transistor emitter diffusion, said first, second, third, fourth and fifth contact diffusions being disposed within said Hall effect region, the lateral dimensions of said second and fourth contact diffusions being reduced by the diffusion of said position defining diffusion to reduce the size of said second and fourth openings prior to deposition of said second and fourth contact diffusions;

first means for connecting said third contact diffusion to a source of power, said first connecting means comprising a metallic layer;

second means for connecting said first and fifth contact diffusions to a point of ground potential, said second connecting means comprises a metallic layer; and third means for connecting said second and fourth contact diffusions to a means for measuring a voltage differential.

20. The integrated circuit of claim 19, wherein:

said first conductivity type material is P type material and said second conductivity type material is N type material, said transistor base diffusion comprising boron, said transistor emitter diffusion comprising a material selected from a group comprising arsenic and phosphorous.

* * * * *